US006689537B2

(12) United States Patent
Urano et al.

(10) Patent No.: US 6,689,537 B2
(45) Date of Patent: Feb. 10, 2004

(54) PHOTOSENSITIVE LITOGRAPHIC PRINTING PLATE AND METHOD FOR MAKING A PRINTING PLATE

(75) Inventors: Toshiyuki Urano, Yokohama (JP); Kazuhiro Kohori, Yokohama (JP); Hideaki Okamoto, Yokohama (JP)

(73) Assignee: Lastra S.p.A., Manerbio (IT)

( * ) Notice: Subject to any disclaimer, the term of this patent is extended or adjusted under 35 U.S.C. 154(b) by 98 days.

(21) Appl. No.: 09/837,655

(22) Filed: Apr. 19, 2001

(65) Prior Publication Data

US 2002/0018962 A1 Feb. 14, 2002

(30) Foreign Application Priority Data

| Apr. 19, 2000 | (JP) | 2000-117803 |
| May 1, 2000 | (JP) | 2000-131995 |
| May 1, 2000 | (JP) | 2000-131996 |
| Nov. 30, 2000 | (JP) | 2000-364310 |
| Dec. 4, 2000 | (JP) | 2000-368412 |
| Dec. 5, 2000 | (JP) | 2000-369415 |
| Jan. 25, 2001 | (JP) | 2001-016537 |

(51) Int. Cl.[7] ............... G03F 7/029; G03F 7/031; G03F 7/11

(52) U.S. Cl. ................. 430/273.1; 430/278.1; 430/284.1; 430/281.1; 430/285.1; 430/302; 522/2

(58) Field of Search ............ 430/284.1, 278.1, 430/281.1, 273.1

(56) References Cited

U.S. PATENT DOCUMENTS

| 3,458,311 A | * | 7/1969 | Alles ................ 430/273.1 |
| 4,162,162 A | * | 7/1979 | Dueber ............... 430/281.1 |
| 4,387,139 A | * | 6/1983 | Herwig et al. ......... 430/284.1 |
| 4,535,052 A | * | 8/1985 | Anderson et al. ....... 430/281.1 |
| 5,229,790 A | * | 7/1993 | Matsuura et al. ....... 346/108 |
| 5,353,048 A | * | 10/1994 | Kanai ................ 346/108 |
| 5,738,974 A | * | 4/1998 | Nagasaka et al. ....... 430/281.1 |
| 5,800,965 A | * | 9/1998 | Tsuji et al. ........... 430/287.1 |
| 5,863,678 A |   | 1/1999 | Urano et al. ......... 430/7 |
| 6,153,356 A |   | 11/2000 | Urano et al. ......... 430/302 |
| 6,232,038 B1 |   | 5/2001 | Takasaki et al. ....... 430/284.1 |
| 6,544,720 B2 |   | 4/2003 | Takasaki et al. ....... 430/284.1 |
| 6,558,875 B1 |   | 5/2003 | Toshimitsu et al. ..... 430/302 |

FOREIGN PATENT DOCUMENTS

| EP | 0 793 145 | 9/1997 |
| EP | 0 985 683 | 3/2000 |
| JP | 9-105810 | 4/1997 |
| JP | 9-105811 | 4/1997 |
| JP | 2000-206690 | 7/2000 |

OTHER PUBLICATIONS

Monroe et al, "Photoinitiators for Free-Radical-initiated Photoimaging Systems," Chem. Rev. 1993, vol. 93, pp. 435–448.*

RN 112–34–5, Registry, Copyright 2003, American Chemical Society, obtained online through STN service, one page.*

Patent Abstracts of Japan, JP 2000–056457, Feb. 25, 2000.

* cited by examiner

*Primary Examiner*—Cynthia Hamilton
(74) *Attorney, Agent, or Firm*—Oblon, Spivak, McClelland, Maier & Neustadt, P.C.

(57) ABSTRACT

A photosensitive lithographic printing plate comprises a photosensitive layer and a protective layer formed in this order on a support, wherein the photosensitive layer has a maximum peak of spectral sensitivity within a wavelength range ranging from 390 to 430 nm, the minimum exposure for the photosensitive lithographic printing plate for image formation at a wavelength of 410 nm (S410) is at most 100 $\mu J/cm^2$, and the relation between the minimum exposure for image formation at a wavelength of 450 nm (S450) and the minimum exposure for image formation at a wavelength of 410 nm (S410) is 0<S410/S450<0.1.

14 Claims, No Drawings

PHOTOSENSITIVE LITHOGRAPHIC PRINTING PLATE AND METHOD FOR MAKING A PRINTING PLATE

BACKGROUND OF THE INVENTION

1. Field of the Invention

The present invention relates to a photosensitive lithographic printing plate which is sensitive to a laser light having a wavelength ranging from 390 to 430 nm and which is suitable for direct drawing from digital signals of e.g. computers, and a method for making a printing plate.

2. Discussion of the Background

Heretofore, a lithography method has been widely used for the microfabrication of e.g. lithographic printing plates, printed boards, color filters, large scale integrated circuits (LSI), thin film transistors (TFT), liquid crystal displays (LCD), plasma display panels (PDP) and semiconductor packagings (TAB), wherein an image forming material having a layer of a photosensitive composition formed on the surface of a support is image-exposed through a mask, to form a pattern which utilizes the difference in solubility of a developer between exposed portions and non-exposed portions of the photosensitive layer.

For example, a photopolymerization initiation system for the resist material for color filters, is a combination of a hexaarylbiimidazole derivative with an aminobenzophenone derivative as taught, for example, in JP 11-327127.

However, the resist material for color filters disclosed in JP 11-327127 is not intended to be exposed to laser light from 390 to 430 nm, but rather is subjected through a mask to the light from the like of e.g. a high-pressure mercury-vapor lamp. Further, since the material contains a large amount of a pigment, a large quantity of energy of 200 mJ/cm$^2$, for example, is required for image formation.

Further, U.S. Pat. No. 5,863,678 discloses a resist material for color filters containing a titanocene compound and a dialkylaminobenzene compound as a photopolymerization initiation system. This patent discloses the use of various kinds of light sources. However, the resist material is also exposed to light through a mask from a high pressure mercury vapor lamp source, practically, and the exposure energy of the light is high at 70 or more mJ/cm$^2$ Further, the above patent does not disclose safe light properties under a yellow lamp for a photosensitive lithographic printing plate.

On the other hand, the laser direct drawing method has attracted attention in recent years as a technique of directly forming an image from digital information supplied by a computer, without using a mask, by employing a laser light as a light source for exposure, since improvement in not only productivity but resolution and accuracy of position and the like is desired. Accordingly, the utilization of a laser light in the lithography method has been actively studied.

With respect to the laser light, various light sources emitting light from the ultraviolet to infrared region are known. Potential laser light for use in image exposure, is light in the visible to infrared region emitted by devices, such as an argon ion laser, a helium-neon laser, a YAG laser and a semiconductor laser. These devices are mentioned from the viewpoint of output, stability, photoperceptivity, cost and the like. For example, various photosensitive compositions have been proposed for use with an argon ion laser having a wavelength of 488 nm and a FD-YAG laser having a wavelength of 532 nm, and a photosensitive lithographic printing plate for exposure to light from these lasers has been placed into practical use. Examples of such photosensitive compositions are a combination of a titanocene compound with a bipyromethene complex and a combination of titanocene with a coumarin derivative as described, for example, in JP 11-271969.

However, no conventional compositions are known which are responsive upon exposure to a violaceous laser light having a wavelength of from 390 to 430 nm.

Further, in an image formation method utilizing such visible laser light, a photosensitive composition showing an adequate absorption at the visible region is used. However, the sensitivity of the composition to violaceous laser light having a wavelength ranging from 390 to 430 nm tends to be inadequate, and safe light properties under a yellow lamp (under environment containing a light having a wavelength of from about 500 to about 750 nm) tend to be poor in some cases, and accordingly the operation has to be conducted in a dark room environment using a red lamp.

On the other hand, JP 61-117549 discloses, as a photosensitive lithographic printing plate which has excellent safe light properties, a photosensitive lithographic printing plate having a protective layer containing a specific coloring agent formed on a photopolymerizable photosensitive composition layer. It discloses, as an exposure source, general-purpose light sources such as α high-pressure mercury-vapor lamps and α metal halide lamps, argon ion lasers, helium-cadmium lasers and krypton lasers as well, and it discloses as a polymerization initiator a complex system of biimidazole and Michler's ketone. However, JP 61-117549, specifically discloses that a composition having a relative sensitivity to light of a wavelength at 480 nm when exposed to a xenon lamp, and a composition responsive to radiation energies required for image formation at 488 nm using an argon ion laser and a composition responsive to light of 442 nm in α the case of using a helium-cadmium laser, have attracted attention. The publication discloses that no attention has been paid to compositions responsive to laser light having an oscillation wavelength of from 390 to 430 nm, particularly from 400 to 420 nm, It also discloses that a composition responsive to radiation energy required for image formation of 0.6 to 1.0 mJ/cm$^2$ to light from a helium-cadmium laser having a wavelength of 442 nm not yet sufficient.

On the contrary, along with significant progress in laser technology in recent years, a laser emitting light in the ultraviolet region, which make operation under a bright room environment such as under a yellow lamp, particularly a semiconductor laser which can stably oscillate in a wave-length region of from 390 to 430 nm, particularly from 400 to 420 nm, has been developed. However, no photosensitive lithographic printing plate suitable for exposure to laser light within the violaceous light region (light ranging from 390 to 430 nm in wavelength) has yet been found.

SUMMARY OF THE INVENTION

Accordingly, one object of the present invention to provide a highly sensitive photosensitive lithographic printing plate which is responsive to violaceous laser light.

Another object of the present invention is to provide a method for making a printing plate using the photosensitive lithographic printing plate.

Briefly, these objects and other objects of the present invention as hereinafter will become more readily apparent can be attained by a photosensitive lithographic printing plate comprising a photosensitive layer and a protective layer formed in this order on a support, wherein the photosensitive layer has a maximum peak of spectral sensitivity within a wavelength range ranging from 390 to 430 nm, the minimum exposure for the photosensitive lithographic printing plate for image formation at a wavelength of 410 nm (S410) is at most 100 µJ/cm$^2$, and the relation between the minimum exposure for image formation at a wavelength of 450 nm (S450) and the minimum exposure for image formation at a wavelength of 410 nm (S410) is 0<S410/S450≦0.1.

A second aspect of the present invention is a photosensitive lithographic printing plate comprising a photosensitive layer and a protective layer formed in this order on a support, the photosensitive layer containing (A) an ethylenic monomer, (B) a sensitizing pigment and (C) a radical generator, wherein the radical generator (C) contains a hexaarylbiimidazole compound or a titanocene compound, and the sensitizing agent (B) contains a dialkylaminobenzene compound.

A third aspect of the present invention is a method for making a printing plate, which comprises image-exposing the photosensitive lithographic printing plate according to the first or second aspect of the present invention, by means of a laser light having a wavelength of from 390 to 430 nm, followed by development of the image by an aqueous developer.

DETAILED DESCRIPTION OF THE PREFERRED EMBODIMENTS

In the first aspect of the present invention the photosensitive lithographic printing plate comprises a photosensitive layer and a protective layer formed in this order on a support, the photosensitive layer having a maximum peak of spectral sensitivity within a wavelength range ranging from 390 to 430 nm, the minimum exposure for image formation at a wavelength of 410 nm being at most 100 µJ/cm$^2$, and the ratio of the minimum exposure for image formation at a wavelength of 41 nm (S410) to the minimum exposure for image formation at a wavelength of 450 nm (S450), i.e. S410/S450 being at most 0.1.

The maximum peak of spectral sensitivity is more preferably within a wavelength range ranging from 400 to 420 nm. If the maximum peak of spectral sensitivity for a photosensitive composition is in a wavelength region less than the above range, the sensitivity to a laser light having a wavelength ranging from 390 to 430 nm (hereinafter sometimes referred to as a laser light in the violaceous region) tends to be poor. On the contrary, if the maximum peak of spectral sensitivity is in a wavelength region exceeding the above range, the sensitivity to laser light in the violaceous region may be high, but the safe light properties of the composition under a yellow lamp tend to be poor.

The minimum exposure for image formation of a composition at a wavelength of 410 nm is at most 100 µ/cm$^2$, preferably at most 50 µJ/cm$^2$, more preferably at most 35 µJ/cm$^2$. If the minimum exposure is more than 100 µJ/cm$^2$, the exposure time tends to be long, such being impractical, although that depends on the exposure intensity of the laser light source.

Here, the lower the lower limit, the better, but it is usually at least 1 µJ/cm$^2$, and it is at least 2.5 µJ/cm$^2$ practically.

In the present invention, the "maximum peak of spectral sensitivity" of a composition may, for example, be determined by a method disclosed in e.g. "Photopolymer Technology" (Tsugio Yamaoka, Nikkan Kogyo Shinbunsha, 1988, page 262) as follows. Samples of a photosensitive image-forming material having a layer consisting of a photosensitive composition (a photosensitive layer) formed on the surface of a support, are irradiated with light emitted from a light source such as a xenon lamp or a tungsten lamp for exposure, using a spectral sensitivity measuring apparatus (Here, the samples are irradiated so that the exposure wavelength linearly decreases in the horizontal axis direction, and the exposure intensity logarithmically decreases in the vertical axis direction.), followed by developing the samples to obtain a resist image depending upon each exposure wavelength, whereupon the exposure energy required for image formation is calculated from the height of the image. The exposure wavelength showing the maximum peak in a spectral sensitivity curve obtained by plotting the wavelength on the horizontal axis and the inverse of the above exposure energy on the vertical axis, corresponds to the maximum peak of spectral sensitivity.

Further, the minimum exposure for image formation at a wavelength of 410 nm is determined as an exposure energy calculated from the height of the image obtained in the same manner as described above using a spectral sensitivity measuring apparatus.

Here, the minimum exposure for image formation is the minimum exposure required to form an image when the photosensitive layer is exposed and developed under optimum development conditions determined by changing, e.g., the developer, such as by changing the pH of the developer, the development temperature or the development time depending upon the type of photosensitive composition used. The minimum exposure is usually the minimum exposure required to form an image by soaking the photosensitive layer in an alkali developer having a pH ranging from 11 to 14 at 25° C. for from 30 seconds to 3 minutes after exposure.

Further, with respect to the photosensitive lithographic printing plate of the present invention, the ratio of the minimum exposure for image formation at a wavelength of 410 nm (S410: J/cm$^2$) to the minimum exposure for image formation at a wavelength of 450 nm (S450: J/cm$^2$) i.e. S410/S450 is at most 0.1. The value of S410/S450 is preferably at most 0.05. That is, when the minimum exposure S450 for image formation at a wavelength of 450 nm is large and the minimum exposure S410 for image formation at a wavelength of 410 nm is small, handling efficiency of the composition tends to be excellent in an environment in which the light has a wavelength in the vicinity of 500 nm, i.e. under a yellow lamp, and accordingly the smaller the above ratio, the better. Here, the minimum of S410/S450 is 0, which indicates that S450 is infinitely large. That is, the photosensitive layer is completely insensitive to a light having a wavelength of 450 nm.

Further, from the viewpoint of handling efficiency under a yellow lamp, the minimum exposure for image formation at a wavelength longer than 450 nm is preferably larger than the minimum exposure for image formation at a wavelength of 450 nm. Specifically, the minimum exposure for image formation at each of wavelength exceeding 450 nm and at most 750 nm is preferably larger than the minimum exposure for image formation at a wavelength of 450 nm (S450). It is particularly preferred that the maximum peak of spectral sensitivity within a wavelength range ranging from 390 to 430 nm of the photosensitive layer is the maximum peak of spectral sensitivity within a wavelength range ranging from 390 to 750 nm.

The above photosensitive lithographic printing plate is particularly useful when exposed to laser light having an oscillation wavelength of from 400 to 420 nm.

The constituency of the photosensitive layer in the photosensitive lithographic printing plate is not particularly limited so long as it satisfies the above definition. However, preferably a photopolymerizable composition is used which contains an ethylenic compound and a photopolymerization initiation system (a combination of a sensitizing agent with a radical generator), which has an advantage over a silver salt type photosensitive composition in view of handling efficiency in waste disposal after development or the like.

The photosensitive lithographic printing plate of the second aspect of the present invention is explained below. The photosensitive lithographic printing plate is a photosensitive lithographic printing plate containing specific constituents to achieve the physical properties of the photosensitive layer of the photosensitive lithographic printing plate of the first aspect of the present invention.

Ethylenic Monomer

In the present invention, the ethylenic monomer (A) is a compound having a radically-polymerizable ethylenic double bond which undergoes addition polymerization by the action of a photopolymerization initiation system, when the photosensitive composition is irradiated with active light radiation, and which undergoes crosslinking and curing in some cases. It may be a compound having one ethylenic double bond in a molecule, and specifically, it may, for example, be an unsaturated carboxylic acid such as acrylic acid, methacrylic acid (hereinafter (meth)acrylic acid), crotonic acid, isocrotonic acid, maleic acid, itaconic acid or citraconic acid, an alkyl ester thereof, (meth)acrylonitrile, (meth)acrylamide or styrene. However, preferred is a compound having at least two ethylenic double bonds in one a molecule from the viewpoint of polymerizability, crosslinking properties and the resulting increase in difference in solubility in a developer of the exposed portions and non-exposed portions of a photosensitive composition.

Suitable ethylenic monomers include (A-1) an ester of an unsaturated carboxylic acid with an aliphatic polyhydroxyl compound, (A-2) a phosphate containing an acryloyloxy group or a methacryloyloxy group, (A-3) a urethane (meth) acrylate or (A-4) an epoxy (meth)acrylate.

The ester of an unsaturated carboxylic acid with an aliphatic polyhydroxyl compound (A-1) may be an ester of the above-mentioned unsaturated carboxylic acid with an aliphatic polyhydroxyl compound such as ethylene glycol, diethylene glycol, triethylene glycol, tetraethylene glycol, propylene glycol, trimethylene glycol, 1,3-butanediol, tetramethylene glycol, neopentyl glycol, hexamethylene glycol, trimethylolethane, trimethylolpropane, glycerol, pentaerythritol, dipentaerythritol or sorbitol. Specific examples of the ester include ethylene glycol di(meth) acrylate, diethylene glycol di(meth)acrylate, triethylene glycol di(meth)acrylate, tetraethylene glycol di(meth)acrylate, propylene glycol di(meth)acrylate, 1,3-butanediol di(meth) acrylate, tetramethylene glycol di(meth)acrylate, neopentyl glycol di(meth)acrylate, hexamethylene glycol di(meth) acrylate, trimethylolethane tri(meth)acrylate, tetramethylolethane tri(meth)acrylate, trimethylolpropane tri(meth) acrylate, glycerol di(meth)acrylate, glycerol tri(meth) acrylate, pentaerythritol di(meth)acrylate, pentaerythritol tri (meth)acrylate, pentaerythritol tetra(meth)acrylate, dipentaerythritol di(meth)acrylate, dipentaerythritol tetra (meth)acrylate, dipentaerythritol penta(meth)acrylate, dipentaerythritol hexa(meth)acrylate, sorbitol tri(meth) acrylate, sorbitol tetra(meth)acrylate, sorbitol penta(meth) acrylate and sorbitol hexa(meth)acrylate, and similar crotonates, isocrotonates, maleates, itaconates and citraconates.

The phosphate containing an acryloyloxy group or a methacryloyloxy group (A-2) embodiment is not particularly limited so long as it is a phosphate compound having a (meth)acryloyloxy group in its structure. Particularly preferred phosphates are those represented by the following formulas (Ia) and (Ib):

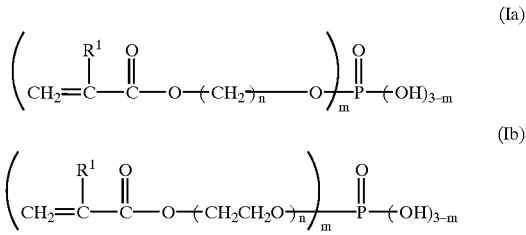

wherein $R^1$ is a hydrogen atom or a methyl group, n is an integer ranging from 1 to 25, and m is 1, 2 or 3.

Here, n preferably ranges from 1 to 10, particularly preferably from 1 to 4, and specific examples include methacryloyloxy ethyl phosphate, bis(methacryloyloxy ethyl)phosphate and methacryloyloxy ethylene glycol phosphate. These compounds may be used alone or as a mixture.

The urethane (meth)acrylate (A-3) may, for example, be a urethane (meth)acrylate of a polyisocyanate compound such as an aliphatic polyisocyanate such as hexamethylene diisocyanate or trimethylhexamethylene diisocyanate, an alicyclic polyisocyanate such as cyclohexane diisocyanate or isophorone diisocyanate or an aromatic polyisocyanate such as tolylene diisocyanate, xylylene diisocyanate or diphenylmethane diisocyanate, with an unsaturated hydroxyl compound such as hydroxymethyl (meth)acrylate, hydroxyethyl (meth)acrylate, glycerol di(meth)acrylate, pentaerythritol tri(meth)acrylate or tetramethylolethane tri (meth)acrylate. Specifically, hexamethylene bis[(meth) acryloyloxy methylurethane], hexamethylene bis[(meth) acryloyloxy ethylurethane], hexamethylene bis{tris[(meth) acryloyloxymethyl]methylurethane} or hexamethylene bis {tris[(meth)acryloyloxymethyl]ethylurethane} may, for example, be mentioned.

The epoxy (meth)acrylate (A-4) may, for example, be an epoxy (meth)acrylate of a polyepoxy compound such as (poly)ethylene glycol polyglycidyl ether, (poly)propylene glycol polyglycidyl ether, (poly)tetramethylene glycol polyglycidyl ether, (poly)pentamethylene glycol polyglycidyl ether, (poly)neopentyl glycol polyglycidyl ether, (poly) hexamethylene glycol polyglycidyl ether, (poly) trimethylolpropane polyglycidyl ether, (poly)glycerol polyglycidyl ether or (poly)sorbitol polyglycidyl ether, with a hydroxy (meth)acrylate compound such as hydroxymethyl (meth)acrylate or hydroxyethyl (meth)acrylate.

Further, another ethylenic monomer may, for example, be an ester of an unsaturated carboxylic acid with an aromatic polyhydroxyl compound such as hydroquinone di(meth) acrylate, resorcin di(meth)acrylate or pyrogallol tri(meth) acrylate, a (meth)acrylhydroxyl compound such as a (meth) acryloyl ethylene oxide addition product of ethylene glycol or a (meth)acryloyl diethylene oxide addition product of 2,2-bis(4-hydroxyphenyl)propane, or a condensate of a polyhydroxyl compound, an unsaturated carboxylic acid and a polyhydric carboxylic acid, such as a condensate of ethylene glycol, (meth)acrylic acid and phthalic acid, a condensate of diethylene glycol, (meth)acrylic acid and maleic acid, a condensate of pentaerythritol, (meth)acrylic acid and terephthalic acid, or a condensate of butanediol, glycerol, (meth)acrylic acid and adipic acid. Further, an amide of the above-mentioned unsaturated carboxylic acid with an aliphatic polyamine compound such as methylene diamine, ethylene diamine, diethylene triamine or hexamethylene diamine, specifically, methylene bis(meth) acrylamide, ethylene bis(meth)acrylamide, diethylene triamine tris(meth)acrylamide or hexamethylene bis(meth) acrylamide may, for example, be mentioned.

A preferred ethylenic monomers is a (meth)acryloyloxy group-containing phosphate, and the content of the (meth) acryloyloxy group-containing phosphate in the photosensitive composition preferably ranges from 1 to 60 wt. %, particularly preferably from 2 to 40 wt. %, based on the entire ethylenic monomer content of the photosensitive layer. Within this range, exposure sensitivity and printing resistance of the photosensitive layer tend to improve, and developing properties of the composition tend to improve (stain at a non-image portion will decrease).

Another preferred ethylenic monomer is urethane (meth) acrylates, and among the urethane (meth)acrylates, a urethane compound (a3) having at least four urethane linkages [—NH—(C=O)—O—] and at least four addition-polymerizable double bonds in one molecule is preferred. The method of producing the urethane compound is not particularly limited, but preferably a compound (a1) having at least four active isocyanate groups in one molecule is reacted with a compound (a2) having at least one hydroxyl group and at least two addition-polymerizable double bonds in one molecule, since a urethane linkage can easily be formed by the addition reaction of an isocyanate group (—N=C=O) with a hydroxyl group.

As to the question of why a composition exhibits improved sensitivity by the addition of the urethane type compound (a3) to a composition, the following may be considered. For example, the formation of active urethane radicals, because of a chain transfer reaction or photopolymerization of multi-functional acrylate groups in the urethane type compound (a3), induces a high photo-setting action, and this photo-setting action is increased by the high molecular weight of the urethane compound (a3).

Compound (a1) having at least four active isocyanate groups in one molecule may, for example, be a compound having at least four active isocyanate groups in the molecule which are introduced by the reaction of a compound having at least two alcoholic hydroxyl groups (hereinafter referred to as polyhydric alcohol) with a compound having at least two isocyanate groups. Specific examples of compound (a1) are prepared by reacting a compound having at least four alcoholic hydroxyl groups in one molecule such as pentaerythritol or polyglycerol with a diisocyanate compound such as hexamethylene diisocyanate, toluene diisocyanate, isophorone diisocyanate or trimethyl hexamethylene diisocyanate; or a compound prepared by reacting a compound containing at least two alcoholic hydroxyl groups in one molecule such as ethylene glycol with a compound containing at least three isocyanate groups in one molecule such as a biuret compound including Duranate 24A-100, 22A-75PX, 21S-75E and 18H-70B manufactured by Asahi Chemical Industry Co., Ltd. or an adduct compound including P-301-75E, E-402-90T and E-405-80T manufactured by Asahi Chemical Industry Co., Ltd.

Further, a compound having at least four isocyanate groups on the average in one molecule may be prepared by homopolymerization of an isocyanate of ethylmethacrylate or by copolymerization of the compound with another component. Specific examples of the compound (a1) having at least four isocyanate groups in one molecule include Duranate ME20-100 (trade name, manufactured by Asahi Chemical Industry Co., Ltd.)

The number of isocyanate groups in compound (a1) is preferably at least 6, particularly preferably at least 7. If the number of isocyanate groups is less than 4, the sensitivity of the resulting composition tends to be poor. The upper limit of isocyanate groups is not particularly limited, but if the number is too high, synthesis tends to be difficult, and accordingly the number of isocyanate units is preferably at most 20. The number of the isocyanate groups may be adjusted by the number of hydroxyl groups in the polyhydric alcohol, the type of compound having at least two isocyanate groups and the blending ratio.

The molecular weight of compound (a1) is usually at least 500, preferably at least 1,000, and at most 200,000, preferably at most 150,000. If the molecular weight is beyond this range, sensitivity of the photosensitive composition tends to decrease.

Compound (a2) having at least one hydroxyl group and at least two addition-polymerizable double bonds in one molecule, constituting urethane compound (a3), may, for example, be a compound having at least one alcoholic hydroxyl group, prepared by esterification of a compound having a plurality of alcoholic hydroxyl groups such as a polyhydric alcohol with a compound containing a carboxyl group and a (meth)acryloyl group, i.e. a reaction product prepared by reacting the above carboxyl group-containing compound in such a proportion that at least one alcoholic hydroxyl group remains. More specifically, compound (a2) may be a hydroxyl group-containing multi-functional acrylate compound having at least one alcoholic hydroxyl group, which is an ester of a polyhydric alcohol with acrylic acid, such as a compound prepared by reaction of 3 mols. of acrylic acid with 1 mol. of pentaerythritol, a compound prepared by reaction of 2 mols. of acrylic acid with 1 mol. of pentaerythritol, a compound prepared by reaction of 5 mols. of acrylic acid with 1 mol. of dipentaerythritol, or a compound prepared by reaction of 4 mols. of acrylic acid with 1 mol. of dipentaerythritol, and specific examples include pentaerythritol triacrylate, pentaerythritol diacrylate, dipentaerythritol diacrylate, dipentaerythritol triacrylate, dipentaerythritol tetraacrylate and dipentaerythritol pentaacrylate. Such a compound may be used alone or as a mixture in a photosensitive composition.

Other examples of compound (a2) include the reaction product of a compound containing an epoxy group such as glycidyl methyl ether with a compound having at least one carboxyl group and at least one addition-polymerizable double bond; a reaction product of a compound having at least one epoxy group and at least one addition-polymerizable double bond with a compound containing at least one carboxyl group; and a reaction product of a compound having at least one carboxyl group and at least one addition-polymerizable double bond with a compound having at least one epoxy group and at least one addition-polymerizable double bond. An example of such a reaction product is the reaction product of glycidyl methacrylate with (meth)acrylic acid. Preferred compounds (a2) are those which have at least three addition-polymerizable double bonds, in view of sensitivity of product photosensitive compositions.

The reaction of compound (a1) with compound (a2), i.e. the reaction of the isocyanate group in compound (a1) with the hydroxyl group in compound (a2), to prepare the urethane compound (a3), may be conducted in accordance with a known method. Specifically, the isocyanate group in compound (a1) and the hydroxyl group in compound (a2) are reacted in a proportion of 1/10 to 10. For example, both compounds can be dissolved in an organic solvent such as toluene or ethyl acetate, followed by heating the solution at a temperature ranging from 10 to 150° C. for 5 minutes to 30 hours. Another suitable method requires the addition of a catalyst such as n-butyl tin dilaurate in a required amount to a solution of the reactants. Still another method is to first dilute compound (a2) in a proper organic solvent and then dropwise add compound (a1) thereto. Yet another satisfactory method is the reverse of the previous method.

The molecular weight of urethane compound (a3) is preferably at least 600. If it is at most 600, the layer consisting of the photosensitive composition (non-cured film) tends to exhibit poor fastness. On the other hand, the upper limit is not particularly limited, but it is preferably at most 150,000 in view of ease of synthesis and availability. The molecular weight may be adjusted on the basis of the types of compounds (a1) and (a2) and the degree of esterification.

Urethane compound (a3) has at least four addition-polymerizable double bonds in view of the desired sensitivity of the product photosensitive composition, but it has more preferably at least six, particularly preferably at least eight double bonds.

The urethane type compound (a3) may be used alone or as a mixture. Particularly when the material of the urethane compound is a mixture, the urethane compound (a3) is used as a mixture of reaction products.

In the production of urethane compound (a3), a functional group other than the addition-polymerizable double bond may be introduced into the molecule for the purpose of controlling various properties of the photosensitive composition. For example, a compound (a4) having a hydroxyl group and a carboxyl group in one molecule in combination with compound (a2) may be reacted with compound (a1) to prepare a compound having at least four urethane linkages, at least four addition-polymerizable double bonds and a carboxyl group in one molecule.

More specifically, a compound (a1') having at least four isocyanate groups in one molecule, a compound (a2') having one hydroxyl group and two addition-polymerizable double bonds in one molecule and a compound (a4') having one hydroxyl group and one carboxyl group in one molecule may be reacted at a molar ratio of a1':a2':a4' of 1:3:1 to produce a compound (a3') having four urethane linkages, and six double bonds and one carboxyl group on the average, in one molecule.

As the compound (a4) for reaction with compound (a1) in combination with compound (a2) (the compound having a hydroxyl group and a carboxyl group in one molecule), specifically, an aliphatic carboxylic acid having a hydroxyl group, such as 2-hydroxyoctanic acid, 2-hydroxyhexanoic acid, 2-hydroxydecanoic acid, 3-hydroxyoctanoic acid or 8-hydroxyoctanoic acid, is preferred, and a $C_{4-20}$ carboxylic acid having a hydroxyl group at the a-position of the carboxylic acid is particularly preferred. A preferred urethane compound (a3) is the urethane compound represented by the following formula (II):

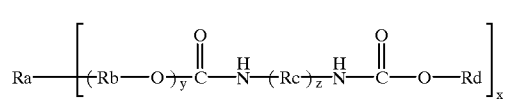
(II)

wherein x is an integer ranging from 4 to 20, y is an integer ranging from 0 to 15, z is an integer ranging from 1 to 15, Ra is a group having a repeating unit derived from alkyleneoxy or aryleneoxy, and having from 4 to 20 oxy groups which are capable of combining with Rb, each of Rb and Rc which are independent of each other, is a $C_{1-10}$ alkylene group, and Rd is an organic residue having from one to ten (meth)acrylic group, provided that each of Ra, Rb, Re and Rd which are independent of one another, may have a substituent.

The alkyleneoxy group which is present in the repeating unit in Ra, may be an alkyleneoxy residue of, e.g. glycerol, pentaerythritol or propylene triol, and the aryleneoxy group which is present in the repeating unit in Ra, may be a phenoxy residue of, e.g. pyrogallol or 1,3,5-benzene triol.

It is preferred that x be an integer ranging from 4 to 15, y be an integer ranging from 1 to 10, z be an integer ranging from 1 to 10, each of Ra and Re which are independent of each other, is a $C_{1-5}$ alkylene group, and Rd is an organic residue having from one to seven (meth)acrylic groups.

More preferably, Ra is

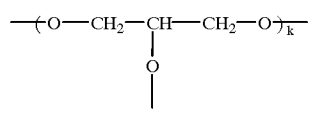

wherein k is from 2 to 10, each of Rb and Re, which are independent of each other, is —$C_2H_4$—, —$CH_2$—$C(CH_3)$— or —$C_3H_6$—, and Rd is

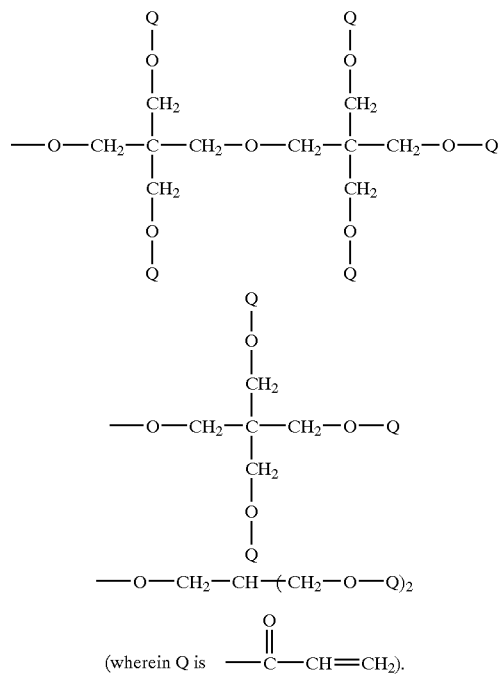

The compounding ratio of urethane compound (a3) ranges from 0.5 to 50 parts by weight, preferably from 1 to 40 parts by weight, more preferably from 2 to 30 parts by weight, based on 100 parts by weight of the ethylenic monomer.

Photopolymerization Initiation System

The photopolymerization initiation system usually contains a radical generator (C) and a sensitizing agent (B) and further contains a hydrogen-donor compound as a polymerization accelerator as the case requires. The radical generator (C) is a compound which receives light excitation energy from the sensitizing agent (B) when the sensitizing agent is irradiated with active light radiation, generates active radicals by the absorbed energy, and causes the above ethylenic monomer to undergo polymerization. The components of the photosensitive layer components of the photosensitive lithographic printing plate of the second aspect of the present invention comprise a hexaarylbiimidazole compound or a titanocene compound as the radical generator (C), and a dialkylaminobenzene compound as the sensitizing agent (B).

The hexaarylbiimidazole compound may be a dimer of an imidazole compound having three aryl groups which generates radicals directly by exposure to a laser ranging in wavelength from 390 to 430 nm or by interaction with the copresent sensitizing agent. The hexaarylbiimidazole compound may, for example, be a hexaarylbiimidazole compound as disclosed in, e.g. JP 45-37377, JP 47-2528 or JP 54-15529, and specifically, it may, for example, be 2,2'-bis(o-chlorophenyl)-4,4',5,5'-tetraphenylbiimidazole,2,2'-bis(o-chlorophenyl)-4,4',5,5'-tetra(p-methoxyphenyl)biimidazole, 2,2'-bis(o-chlorophenyl)-4,4',5,5'-tetra(p-methylphenyl)biimidazole, 2,2'-bis(o-chlorophenyl)-4,4',5,5'-tetra(p-ethoxycarbonylphenyl)biimidazole, 2,2'-bis(o-chlorophenyl)-4,4',5,5'-tetra(p-fluorophenyl)biimidazole, 2,2'-bis(o-bromophenyl)-4,4',5,5'-tetra(p-iodophenyl)biimidazole, 2,2'-bis(o-chlorophenyl)-4,4',5,5'-tetra(p-chloronaphthyl)biimidazole, 2,2'-bis(o-chlorophenyl)-4,4', 5,5'-tetra(p-chlorophenyl)biimidazole, 2,2'-bis(o-bromophenyl)-4,4',5,5'-tetra(p-chlor-p-methoxyphenyl)biimidazole, 2,2'-bis(o-chlorophenyl)-4,4',5,5'-tetra(o,p-dichlorophenyl)biimidazole, 2,2'-bis(o-chlorophenyl)-4,4', 5,5'-tetra(o,p-dibromophenyl)biimidazole, 2,2'-bis(o-bromophenyl)-4,4',5,5'-tetra(o,p-dichlorophenyl)biimidazole, or 2,2'-bis(o,p-dichlorophenyl)-4,4',5,5'-tetra (o,p-dichlorophenyl)biimidazole. Of these compounds, preferred is a hexaphenylbiimidazole compound, particularly preferred is one which has the ortho-positions of the benzene rings at the 2,2'-positions on the imidazole rings replaced with halogen, more preferred is one having benzene rings at the 4,4',5,5'-positions on the imidazole rings not replaced, replaced with halogen or replaced with alkoxycarbonyl, and most preferred is a combination of embodiments of the two hexaphenylbiimidazole compounds.

Such a hexaarylbiimidazole may be used in combination with various biimidazoles as the case requires. The biimidazoles can easily be synthesized by the method disclosed in Bull. Chem. Soc. Japan. 33,565 (1960) or J. Org. Chem. 36[16]2262 (1971).

Suitable titanocene compounds, include titanium compounds having a dicyclopentadienyl structure and a biphenyl structure, such as dicyclopentadienyl titanium dichloride, dicyclopentadienyl titanium bisphenyl, dicyclopentadienyltitanium bis(2,4-difluorophenyl), dicyclopentadienyl titanium bis(2,6-difluorophenyl), dicyclopentadienyl titanium bis(2,4,6-trifluorophenyl), dicyclopentadienyl titanium bis(2,3,5,6-tetrafluorophenyl), dicyclopentadienyl titanium bis(2,3,4,5,6-pentafluorophenyl), di(methylcyclopentadienyl) titanium bis(2,6-difluorophenyl), di(methylcyclopentadienyl) titanium bis(2, 3,4,5,6-pentafluorophenyl) or dicyclopentadienyl titanium bis[2,6-difluoro-3-(1-pyrrolyl)phenyl], may, for example, be mentioned, and a preferred compound is one having the o-positions of the biphenyl ring replaced with a halogen atom.

Further, it is preferred to use, as a radical generator, the above hexaarylbiimidazole compound and the titanocene compound in combination.

The dialkylaminobenzene type compound which is used as the sensitizing agent (B) may have any optional substituent so long as it is a compound which has a dialkylaminobenzene structure, absorbs light having a wavelength ranging from 390 to 430 nm, and efficiently generates radicals from the radical generator by interaction with the radical generator. Preferred is a dialkylaminobenzophenone compound, a dialkylaminobenzene compound having an aromatic heterocyclic group as a substituent on the carbon atom at the p-position relative to the amino group on the benzene ring, or a compound having a nitrogen-containing heterocyclic structure formed by linkage of the alkyl groups constituting the dialkylamino group in said compound and/ or by linkage of said alkyl group with the carbon atom on the benzene ring adjacent to the carbon atom to which the amino group is bonded. Here, the amino groups constituting the dialkylamino group may be the same or different, and have a carbon number of preferably ranging from 1 to 6.

Of these compounds, particularly preferred are dialkylaminobenzene compounds represented by the following formulae (IIIa) and (IIIb):

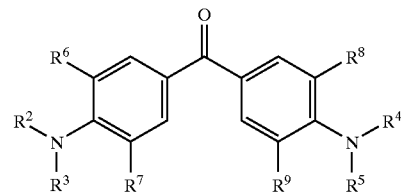

(IIIa)

wherein each of $R^2$ to $R^5$, which are independent of one another, is a $C_{1-6}$ alkyl group, and each of $R^6$ to $R^9$ is a hydrogen atom or a $C_{1-6}$ alkyl group, provided that $R^2$ and $R^3$, $R^4$ and $R^5$, $R^2$ and $R^6$, $R^3$ and $R^7$, $R^4$ and $R^8$, or $R^5$ and $R^9$, may be bonded to each other to form a ring;

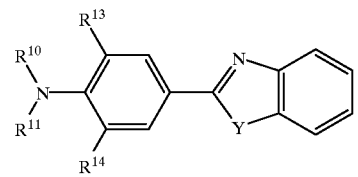

(IIIb)

wherein each of $R^{10}$ and $R^{11}$, which are independent of each other, is a $C_{1-6}$ alkyl group, each of $R^{13}$ and $R^{14}$ which are independent of each other, is a hydrogen atom or a $C_{1-6}$ alkyl group, Y is a sulfur atom, an oxygen atom, dialkylmethylene or —N($R^{15}$)—, and $R^{15}$ is a hydrogen atom or a $C_{1-6}$ alkyl group, provided that $R^{10}$ and $R^{11}$, $R^{10}$ and $R^{13}$, or $R^{11}$ and $R^{14}$ maybe bonded to each other to form a ring. Here, the carbon number of each alkyl group in the dialkylmethylene ranges from 1 to 6, preferably 1.

In a case where a pair of two of $R^2$ to $R^{14}$ is bonded to form a ring, preferred is a 5- or 6-membered ring, and particularly preferred is a 6-membered ring.

Suitable compounds represented by formula (IIIa), include 4,4'-dimethylaminobenzophenone, 4,4'-diethylaminobenzophenone and the following compounds:

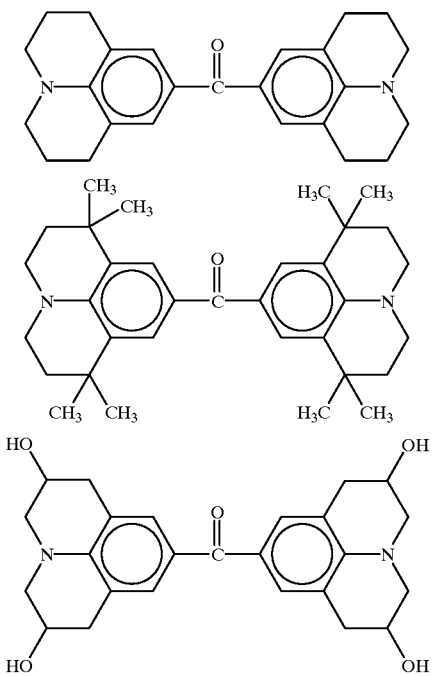

The compound having formula (IIIb) may be 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole or the following compound:

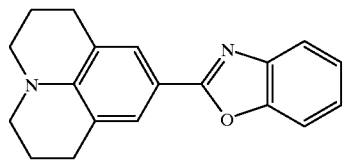

As a dialkylaminobenzene compound other than those of the formulae (IIIa) and (IIIb), 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine may, for example, be mentioned.

Here, in view of the important factor of the handling efficiency of a photosensitive composition under a yellow lamp, particularly in order that the ratio of S410/S450 is at most 0.1, preferred is a photopolymerization initiation system consisting of a combination of the hexaarylbiimidazole compound as the radical generator (C) with the dialkylaminobenzene compound as the sensitizing agent (B).

Further, the photosensitive composition of the present invention, which is to be exposed to violaceous light, preferably contains a hydrogen-donor compound component as a polymerization accelerator in addition to the above components, for the purpose of improving photopolymerization initiation performance.

Specific examples of the hydrogen-donor compound include compounds having a mercapto group such as 2-mercaptobenzothiazole, 2-mercaptobenzimidazole, 2-mercaptobenzoxazole and 3-mercapto-1,2,4-triazole, N,N-dialkyl benzoic alkyl ester, N-aryl-a-amino acids, their salts and esters such as N-phenylglycine, salts of N-phenylglycine, and alkyl esters of N-phenylglycine such as N-phenylglycine ethyl ester and N-phenylglycine benzyl ester, and compounds represented by the following formula (IV):

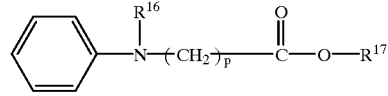

wherein $R^{16}$ is a hydrogen atom or an alkyl group which may have a substituent, $R^{17}$ is a hydrogen atom, an alkyl group which may have a substituent, a vinyl group which may have a substituent, an aryl group which may have a substituent, a (meth)acryloyl group which may have a substituent, an aryl group which may have a substituent or an aromatic heterocyclic group which may have a substituent, and the benzene ring of the compound may have a substituent, and p is a integer ranging from 2 to 10.

The photosensitive lithographic printing plate ofthe present invention preferably contains a polymer binder in addition to the above components in the photosensitive layer, for the purpose of improving, e.g. development properties or coating properties, when the photosensitive layer is coated on a substrate.

Specific examples of the polymer binder include homopolymers and copolymers of, e.g. (meth)acrylic acid, (meth)acrylic ester, (meth)acrylamide, maleic acid, (meth)acrylonitrile, styrene, vinyl acetate, vinylidene chloride and maleimide, and polyethylene oxide, polyvinyl pyrrolidone, polyamide, polyurethane, polyester, polyether, polyethylene terephthalate, acetyl cellulose and polyvinyl butyral.

Of these binder materials, preferred is a copolymer containing carboxyl groups in its molecule and containing, as copolymerizable components, (meth)acrylic acid and at least one (meth)acrylate which may be substituted, such as methyl (meth)acrylate, ethyl (meth)acrylate, propyl (meth)acrylate, butyl (meth)acrylate, 2-ethylhexyl (meth)acrylate, hydroxyethyl (meth)acrylate or benzyl (meth)acrylate (hereinafter referred to as "carboxyl group-containing copolymer").

The acid value of the carboxyl group-containing polymer binder, preferably ranges from 10 to 250 KOH.mg/g, and the weight average molecular weight calculated as polystyrene (hereinafter referred to simply as Mw) preferably ranges from 5,000 to 1,000,000, more preferably from 10,000 to 500,000. Such a polymer binder preferably has unsaturated bonds in its side chains, and a resin obtained by reacting a compound having both epoxy group and unsaturated group with the above carboxyl group-containing copolymer may be mentioned.

Suitable compounds having both an epoxy group and an unsaturated group include aliphatic epoxy group-containing unsaturated compounds such as allyl glycidyl ether, glycidyl (meth)acrylate, α-ethylglycidyl (meth)acrylate, glycidyl crotonate, glycidyl isocrotonate, crotonyl glycidyl ether, monoalkyl monoglycidyl itaconate, monoalkyl monoglycidyl fumarate or monoalkyl monoglycidyl maleate, or 3,4-epoxycyclohexylmethyl (meth)acrylate. Of these compounds, preferred is allyl glycidyl ether, glycidyl (meth)acrylate or 3,4-epoxycyclohexylmethyl (meth)acrylate, and more preferred is 3,4-epoxycyclohexylmethyl (meth)acrylate.

Also preferred is a compound having the structural unit (monomer unit) represented by the following formula (V):

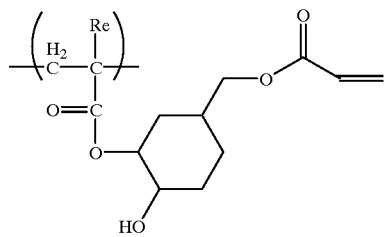

wherein Re is a hydrogen atom or a methyl group.

Of the above-mentioned resins having both carboxyl groups and double bonds in their side chains, a preferred molecular weight, Mw ranges from 10,000 to 1,000,000, preferably from 20,000 to 500,000. Further, preferred is a resin having from 1 to 50, preferably from 5 to 40 units of double bonds introduced in the side chains based on 100 monomer units of the main chain.

The photosensitive lithographic printing plate of the present invention preferably contains, in the photosensitive layer, an amine compound having a pKb (dissociation constant) of at most 7 at 25° C. or an amino compound having an atomic group [N—CH$_2$] in its molecule, for the purpose of improving sensitivity to a laser light having a wavelength within a range of ranging from 390 to 430 nm. The photosensitive lithographic printing plate more preferably contains, in the photosensitive layer, an amine compound having a pKb of at most 7 at 25° C. and has the group [N—CH$_2$] in its molecule.

The amine compound may be any one of aliphatic, alicyclic and aromatic amines so long as the above conditions are satisfied, and the hydrocarbon group in said amine may have a substituent. Further, the amine compound is not limited to a monoamine, since it may be a polyamine such as a diamine or a triamine, and it may be a primary amine, a secondary amine or a tertiary amine. However, in view of pKb values, an aliphatic amine having a hydrocarbon group which may have a substituent is much preferred and a tertiary amine is particularly preferred.

The pKb value of the amine is preferably at most 5. Further, the lower limit of the pKb value is preferably at least 3. Further, an amine having the group [CH$_2$—N—CH$_2$] in its molecule is more preferred.

Specifically, an aliphatic amine which may be replaced with a hydroxyl group or a phenyl group, such as butylamine, dibutylamine, tributylamine, amylamine, diamylamine, triamylamine, hexylamine, dihexylamine, trihexylamine, benzylamine, dibenzylamine, tribenzylamine, triethanolamine, allylamine, diallylamine or triallylamine, may be mentioned.

As the amine compound for use in the present invention, since it practically has to remain in the photosensitive layer when the photosensitive layer is coated and dried, and since it has to be used without presenting any problems in handling such as odor, a preferred amine compound is one which has a boiling point of at least 80° C. under normal pressure, and particularly preferred is one which has a boiling point of at least 150° C. and which is solid at room temperature (25° C.). Further, a triaralkyl amine is preferred since it does not decrease the dispersibility of the coloring pigment. From this viewpoint, and taking availability into consideration, tribenzylamine is a particularly preferred example.

The reasons for improvement in sensitivity as a result of addition of the amine are believed to be as follows.

(1) The formation of active amino radicals by a chain transfer reaction of an amine with radicals generated in the photopolymerization initiation mechanism or polyacrylate radicals formed by photopolymerization of an acrylate monomer by the action of the radicals.

(2) In a sensitizing step by electron transfer from a light excitation sensitizing agent to a radical generator, the sensitizing agent cation and radical generator anion are formed, but in general, a reverse electron transfer to the pigment cation deactivates the radical generator anion. The amine transfers electron to the sensitizing agent cation and changes the cation to a neutral sensitizing agent, and it thereby suppresses the reverse electron transfer, increases decomposition efficiency of the radical generator anion, and increases the radical generation effect.

(3) The amine significantly increases the elution rate particularly of the non-image portion or a photosensitive layer in an inadequately cured state to an alkali developer at the time of alkali development, and it thereby prevents loss of the photo-set photosensitive layer and increases sensitivity.

For the photosensitive layer of the photosensitive lithographic printing plate of the second aspect of the present invention, a combination of the above ethylenic monomer, the hexaarylbiimidazole compound (radical generator) and the dialkylaminobenzene compound (sensitizing agent), as the photopolymerization initiation system, or a combination of the above ethylenic monomer, the titanocene compound (radical generator) and the dialkylaminobenzene compound (sensitizing agent) is essential. The compounding ratio of each component of the composition, based on 100 parts by weight of the ethylenic monomer, is such that the amount of the hexaarylbiimidazole compound preferably ranges from 5 to 60 parts by weight, more preferably from 15 to 40 parts by weight, the amount of the titanocene compound preferably ranges from 1 to 30 parts by weight, more preferably from 5 to 20 parts by weight, and the amount of the dialkylaminobenzene compound preferably ranges from 1 to 30 parts by weight, more preferably from 5 to 20 parts by weight. Further, the compositional ratio of the sensitizing agent to the radical generator is such that the dialkylaminobenzene compound preferably ranges from 0.1 to 5 parts by weight, more preferably from 0.2 to 3 parts by weight, based on 1 part by weight of the hexaarylbiimidazole compound, and the dialkylaminobenzene compound ranges from 0.5 to 6 parts by weight, more preferably from 0.5 to 1.8 parts by weight, based on 1 part by weight of the titanocene compound.

Further, in the case where the polymerization accelerator (hydrogen-donor compound) is incorporated in the composition for the purpose of improving photopolymerization initiation performance, it is incorporated in an amount preferably ranging from 1 to 50 parts by weight, more preferably from 10 to 40 parts by weight, based on 100 parts by weight of the ethylenic monomer component.

Further, in the case where the polymer binder is incorporated in the composition, it is incorporated in an amount preferably ranging from 50 to 500 parts by weight, more preferably from 70 to 200 parts by weight, based on 100 parts by weight of the ethylenic monomer.

The photosensitive layer of the lithographic printing plate to be used in the present invention may contain another substance depending upon the purpose for its use. For example, a coating property-improving agent such as a nonionic, anionic, cationic or fluorine type surface active agent; a thermal polymerization inhibitor such as hydroquinone, p-methoxyphenol or 2,6-di-t-butyl-p-cresol; a coloring pigment of an organic or inorganic dye or pigment (which is different from the above sensitizing agent, which is substantially incompatible with a coating solvent or a photosensitive layer component, and which has no sensitizing function); a plasticizer such as dioctyl phthalate, didodecylphthalate or tricresyl phosphate; a sensitivity properties-improving agent such as a tertiary amine or a thiol; or another additive such as a pigment precursor, an antifoaming agent, a visible image-imparting agent, an adhesion-improving agent, a development property-improving agent or an ultraviolet absorber, may be added.

With respect to preferred amounts of the above additives based on 100 parts by weight of the ethylenic monomer, the thermal polymerization inhibitor is at most 2 parts by weight, the coloring pigment is at most 20 parts by weight, the plasticizer is at most 40 parts by weight, the pigment precursor is at most 30 parts by weight, and the surface active agent is at most 10 parts by weight.

Particularly, if the content of the coloring pigment is too high, the performance of the present invention may be inadequate. Accordingly, the content of the coloring pigment is preferably at most 20 wt. % of the photosensitive composition.

The above photosensitive composition is diluted with a proper solvent, and coated and dried on a support to form the photosensitive layer.

The support which is used in the present invention may be any of the conventional ones used for photosensitive lithographic printing plates, and it may, for example, be a metal plate of, e.g., aluminum, zinc, iron, copper or an alloy thereof, a metal plate having chromium, zinc, copper, nickel, aluminum, iron or the like plated or vapor-deposited thereon, a paper sheet, a plastic film, a glass sheet, a resin-coated paper sheet, a paper sheet having a metal foil such as an aluminum foil bonded thereto, or a plastic film having hydrophilic treatment applied thereto. Among them, preferred is a plate of aluminum or an aluminum alloy (hereinafter referred to as an aluminum support).

The thickness of the aluminum support usually ranges from about 0.01 to about 10 mm, preferably from about 0.05 to about 1 mm.

The surface on at least the photosensitive layer composition side of the aluminum support is subjected to surface roughening, and then an anodic oxidation treatment is conducted. A degreasing treatment, a sealing treatment, an undercoating treatment or the like may further be conducted as the case requires. A degreasing treatment is conducted usually before the surface roughening, and the degreasing treatment is conducted in accordance with a conventional method such as by wiping, soaking or steam-washing the support with a solvent, by soaking or spraying the support with an aqueous alkali solution, followed by neutralization with an aqueous acid solution, or by soaking or spraying the support with a surface active agent. Surface roughening may be accomplished by a known technique such as brush polishing, ball polishing, electrolytic etching, chemical etching, liquid honing or sand blasting, or a combination thereof. Preferred is brush polishing, ball polishing, electrolytic etching, chemical etching or liquid honing.

The aluminum plate which is surface roughened is further subjected to a desmutting treatment with an aqueous acid or alkali solution as the case requires. The desmutting treatment is conducted by soaking the plate in an aqueous solution of an acid such as sulfuric acid, nitric acid, hydrochloric acid, phosphoric acid or chromic acid, or in an aqueous solution of an alkali such as sodium hydroxide, potassium hydroxide, sodium metasilicate, sodium phosphate, sodium pyrophosphate, potassium phosphate or sodium aluminate, or by spraying one of these aqueous solutions onto the plate. The aluminum plate thus obtained is usually subjected to an anodic oxidation treatment, particularly preferably a treatment with an electrolytic solution containing sulfuric acid. The method of anodic oxidation treatment with an electrolytic solution containing sulfuric acid may be conducted in accordance by a known method such as disclosed in JP 58-213894. Specifically, it is conducted, for example, at a sulfuric acid content ranging from 5 to 50 wt. %, preferably from 15 to 30 wt. %, at a temperature ranging from about 5 to about 50° C., preferably from 15 to 35° C., at a current density ranging from 1 to 60 A/dm$^2$ for from about 5 to about 60 seconds. Further, as the case requires, the substrate surface may be treated with hot water or with an alkali silicate such as a silicate of soda, or by soaking the plate in an aqueous solution containing an aqueous polymer compound such as polyvinyl phosphonic acid or a resin having a cationic quaternary ammonium group. The thickness of the aluminum support usually ranges from 0.01 to 10 mm, preferably from about 0.05 to about 1 mm, and with respect to the surface roughness, the average roughness Ra as stipulated in JIS B0601 usually ranges from 0.3 to 1.0 μm, preferably from about 0.4 to about 0.8 μm.

The photosensitive lithographic printing plate used in the present invention is exposed by means of a laser light at relatively low exposure. Accordingly, it is effective to leave smut on the surface of the substrate so as to increase the adhesion of the photosensitive composition, within a range at which it does not exert an adverse influence such as staining during printing or impairing development properties. The residual amount of the smut is preferably ranges from 0.3 to 0.5, more preferably from 0.32 to 0.45, as shown by the reflection density on the surface on the photosensitive composition side. When the reflection ratio is within the above range, printing resistance will improve.

Further, in the case where the desmutting treatment is conducted, it is preferred to control the desmutting conditions so that D−E≦0.1, where D is the reflection density on the surface at the photosensitive composition side immediately after the surface roughening treatment, and E is the reflection density on the surface of the photosensitive composition side after the anodic oxidation treatment. More preferably, D−E≦0.08. The lower limit of D−E has not been established with particularity, but preferably is 0.1≦D−E.

The reflection density is measured by means of a reflection densitometer in its visual mode without using a filter. The desmutting of a surface may be performed by soaking the substrate in an aqueous NaOH solution at a concentration preferably ranging from 0.1 to 4 wt. %, at a liquid temperature ranging from about 5 to about 30° C. for from about 1 to about 10 seconds, depending on the state of the surface roughening and the aqueous alkali solution used.

The photosensitive composition may be coated on a surface by a known method such as by dip coating, coating by means of a rod, spinner coating, spray coating or roll coating. The amount coated varies depending upon the particular use, but preferably ranges from 0.5 to 100 g/m$^2$ as a dry film thickness, and preferably ranges from 0.5 to 5 g/m$^2$. Here, the temperature for drying ranges from about 30 to about 150° C., preferably from about 40 to about 110° C., and the drying time ranges from about 5 seconds to about 60 minutes, preferably from about 10 seconds to about 30 minutes.

A protective layer (oxygen-shielding layer) is provided on the photosensitive layer in order to prevent polymerization inhibition due to the presence of oxygen. Specific examples of protective layers are those formed from water-soluble polymers such as a polyvinyl alcohol, polyvinyl pyrrolidone, polyethylene oxide and cellulose. Among them, preferred is a polyvinyl alcohol having high oxygen gas barrier properties. It is also preferred to use a polyvinyl alcohol and polyvinyl pyrrolidone in combination, and in this case, preferably from 1 to 20 parts by weight, more preferably from 3 to 15 parts by weight, of polyvinyl pyrrolidone is used based on 100 parts by weight of the polyvinyl alcohol.

The photosensitive lithographic printing plate of the present invention may be formed in a manner such that the photosensitive layer consists of a photosensitive composition having a maximum peak of spectral sensitivity outside the wavelength range ranging from 390 to 430 nm, then a protective layer which functions by adjusting the transmission of light is formed on the photosensitive layer so as to form, for example, a layer made of a photosensitive composition having a maximum peak of spectral sensitivity within a wavelength range ranging from 430 to 460 nm, and on the photosensitive layer, a protective layer showing absorption within a range ranging from 430 to 500 nm is formed, so that the maximum peak of spectral sensitivity is within a wavelength range ranging from 400 to 420 nm, and the absolute sensitivity is at most 100 $\mu J/cm^2$ at a wavelength of 410 nm resultingly.

A preferred aspect of the invention is that the photosensitive composition which constitutes the photosensitive layer in the above case, is one in which the polymerization initiation system is changed, specifically to a combination of the above titanocene compound with a coumarin compound. Suitable coumarin compounds include coumarin pigments as disclosed in e.g. JP 6-301208, JP 8-146605, JP 8-211605, JP 8-129258 or JP 8-129259. The coumarin pigment is a pigment which has the following skeleton in its structure.

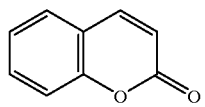

In the case of forming a photosensitive layer using a photosensitive composition which undergoes photo-radical polymerization, an oxygen-shielding layer is preferably formed on the photosensitive layer as mentioned above so as to prevent radical polymerization inhibition due to the action of oxygen, and it is possible to employ the oxygen-shielding layer as a protective layer and to adjust the components in the protective layer on order to adjust the maximum peak of spectral sensitivity as the photosensitive lithographic printing plate to within a wavelength range of 400 to 440 nm. The protective layer may contain a water-soluble polymer similar to one in the above oxygen-shielding layer as the main component, and contains a compound which absorbs a light having the above desired wavelength.

The third aspect of the invention of making a lithographic printing plate using the photosensitive composition of the present invention is as follows.

In order to prepare the printing plate of the present invention, the lithographic printing plate of the invention is exposed by means of a laser having a wavelength ranging from 390 to 430 nm, followed by development to remove non-exposed portions of the photosensitive layer to form an image.

The source of light for image formation is not particularly limited as long as it is laser light having an oscillation wavelength ranging from 390 to 430 nm. Preferred is laser light having an oscillation wavelength ranging from 400 to 420 nm, and particularly advantageous is an indium gallium nitride semiconductor laser emitting light having a wavelength in the vicinity of 410 nm.

Exposure of the lithographic printing plate is conducted by employing a laser beam having an oscillation wavelength ranging from 390 to 430 nm, preferably from 400 to 420 nm, as a beam spot having a diameter ranging from 2 to 30 $\mu m$, preferably from 4 to 20 $\mu m$, at an output light intensity of the laser ranging from 1 to 100 mW, preferably from 3 to 70 mW, and by moving the beam spot at a scanning rate ranging from 50 to 500 m/s, preferably from 100 to 400 m/s.

Image-exposure is conducted so that exposure of the lithographic printing plate (printing plate exposure) to laser light is at most 100 $\mu J/cm^2$, preferably at most 50 $\mu J/cm^2$. The lower limit is preferably as low as possible, but is usually at least 1 $\mu J/cm^2$, and is practically at least 5 $\mu J/cm^2$. Further, the higher the scanning density upon exposure, the greater the high-definition image formation. Accordingly, the scanning density is preferably at least 2,000 dpi, more preferably at least 4,000 dpi.

The photosensitive lithographic printing plate of the present invention is image-exposed by means of the above light source, followed by development of the image with an aqueous developer consisting mainly of water, preferably with an aqueous solution containing a surface active agent and an alkali component.

The aqueous solution may further contain an organic solvent or a buffering agent. A preferred buffering agent is an alkali component such as an inorganic alkali compound such as sodium silicate, potassium silicate, sodium hydroxide, potassium hydroxide, lithium hydroxide, tribasic sodium phosphate, dibasic sodium phosphate, sodium carbonate, potassium carbonate and sodium bicarbonate, an organic amine compound such as trimethylamine, diethylamine, isopropylamine, n-butylamine, monoethanolamine, diethanolamine and triethanolamine. These compounds may be used alone or in combination. The pH of the alkali developer usually ranges from about 9 to about 14, preferably from 11 to 14.

Surface active agents include a nonionic surface active agent such as a polyoxyethylene alkyl ether, a polyoxyethylene alkyl aryl ether, a polyoxyethylene alkyl ester, a sorbitan alkyl ester or a monoglyceride alkyl ester, an anionic surface active agent such as an alkyl benzene sulfonate, an alkyl naphthalene sulfonate, an alkyl sulfate, an alkyl sulfonate or a sulfosuccinate, or an ampholytic surface active agent such as an alkyl betaine or an amino acid. Further, suitable organic solvents include isopropyl alcohol, benzyl alcohol, ethyl cellosolve, butyl cellosolve, phenyl cellosolve, propylene glycol and diacetone alcohol.

The method of development employed is not particularly limited, and may be conducted by soaking and shaking the plate in a developer, by physically removing non-image portions which is at the point of being dissolved in a developer by means of e.g. a brush, or by spraying a developer onto the plate so as to remove a non-image portions. The time for development is selected depending upon the above method used so that the non-image portions can adequately be removed, and is optionally selected within a range of 5 seconds to 10 minutes.

After the development, the plate may be subjected to a hydrophilic treatment by means of, e.g., gum arabic optionally applied to the printing plate as the case requires. Further, the oxygen-shielding layer may be initially washed with water before development as the case requires.

Having now generally described this invention, a further understanding can be obtained by reference to certain specific examples which are provided herein for purposes of illustration only and are not intended to be limiting unless otherwise specified.

Preparation of an aluminum support (1)

An aluminum plate having a thickness of 0.3 mm was degreased with a 3 wt. % aqueous sodium hydroxide solution, subjected to electrolytic etching in a hydrochloric acid bath of 11.5 g/l at 25° C. at a current density of 80 A/dm$^2$ for 11 seconds, and washed with water. Then, the plate was subjected to anodic oxidation in a sulfuric acid bath of 30 wt. % at 30° C. at 11.5 A/dm$^2$ for 15 seconds, washed with water and dried to prepare an aluminum plate as a lithographic printing plate (hereinafter referred to simply as support (1)).

Preparation of an aluminum support (2)

An aluminum plate (thickness: 0.24 mm) was degreased with a 3 wt. % aqueous sodium hydroxide solution, and subjected to electrolytic etching in a nitric acid bath of 18.0 g/l at 25° C. at a current density of 90 A/dm$^2$ for 11 seconds. Then, the plate was subjected to a desmutting in a 4.5 wt. % aqueous sodium hydroxide solution at 30° C. for 2 seconds, neutralized in a 10 wt. % aqueous nitric acid solution at 25° C. for 5 seconds, washed with water, and then subjected to an anodic oxidation treatment in a nitric acid bath of 30 wt. % at 30° C. at a current density of 10 A/dm$^2$ for 16 seconds, and washed with water and dried to prepare a support.

The reflection density of the support (measured by a reflection densitometer (RD-918 manufactured by Macbeth) was 0.32. Further, during this production step, A−B=0.08 (where A is the reflection density on the surface at the photosensitive composition side immediately after the surface roughening treatment, and B is the reflection density on the surface at the photosensitive composition side immediately before the anodic oxidation treatment).

Hereinafter the support thus obtained will be referred to simply as "support (2)".

EXAMPLES

Examples 1 to 15 and Comparative Examples 1 to 5

A coating fluid of the following photosensitive composition was coated onto support (1) by means of a bar coater and dried so that the dried film thickness became 2 g/m$^2$ (drying condition: 170° C., 2 minutes). Further, the following protective layer coating fluid (1) was coated thereon by means of a bar coater and dried so that the dried film thickness became 3 g/m$^2$ (drying condition: 170° C., 2 minutes) to prepare a photosensitive lithographic printing plate.

| Protective layer coating fluid (1) | |
|---|---|
| Polyvinyl alcohol (GL-03 manufactured by Nippon Synthetic Chemical Industry Co., Ltd.) | 90 parts by weight |
| Polyvinyl pyrrolidone (Mw = 4,000) | 5 parts by weight |
| Water | 1,000 parts by weight |
| Photosensitive composition coating fluid | |
| Radical generator (compound as identified in Table 1) | Amount as shown in Table 1 |
| Sensitizing agent (compound as identified in Table 1) | Amount as shown in Table 1 |
| Polymer binder (the following compound P-1) | 45 parts by weight |
| Ethylenic monomer 1 (the following compound E-1) | Amount as shown in Table 1 |
| Ethylenic monomer 2 (the following compound E-2) | 22 parts by weight |
| Ethylenic monomer 3 (the following compound E-3) | Amount as shown in Table 1 |
| Ethylenic monomer 4 (the following compound E-4) | Amount as shown in Table 1 |
| 2-mercaptobenzothiazole | 5 parts by weight |
| N-phenylglycine benzylester | Amount as shown in Table 1 |
| Tribenzylamine | Amount as shown in Table 1 |
| Copper phthalocyanine pigment (visible image agent) | 4 parts by weight |
| Emulgen 104 P (surface active agent, manufactured by Kao Corporation) | 2 parts by weight |
| S-381 (fluorine type surface active agent, manufactured by Asahi Glass Company, Limited) | 0.3 part by weight |
| Disperbyk 161 (dispersing agent, manufactured by Big Chemie) | 2 parts by weight |
| Propylene glycol monomethyl ether acetate | 400 parts by weight |
| Cyclohexanone | 740 parts by weight |

Among the components of the photosensitive composition, the structures of the radical generator, the sensitizing agent, the polymer binder and the ethylenic monomer are as follows:

Radical generator

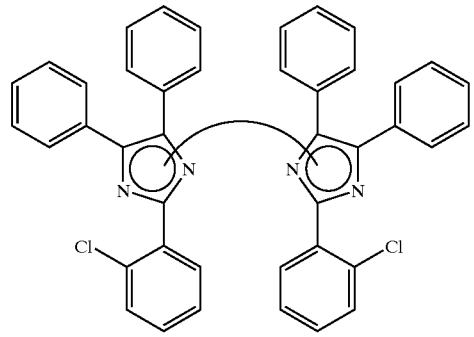

R-1

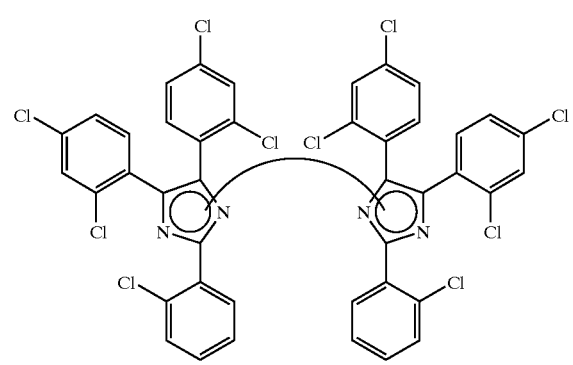

R-2

-continued
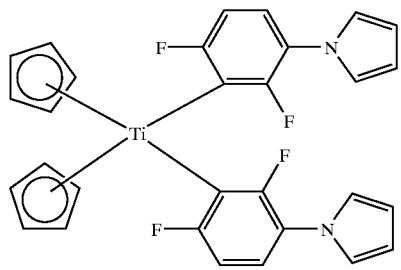
R-3
Sensitizing agent
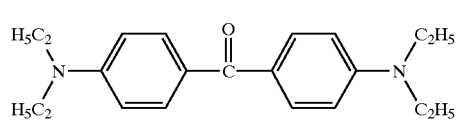
S-1
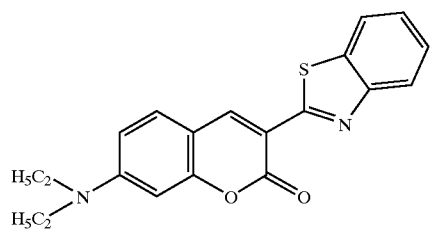
S-2
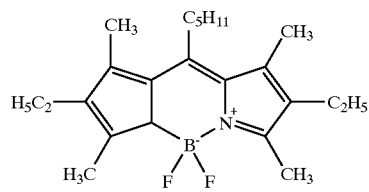
S-4
Polymer binder
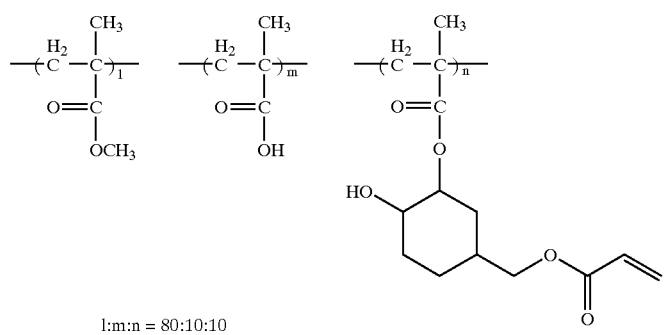
P-1
l:m:n = 80:10:10

Ethylenic monomer

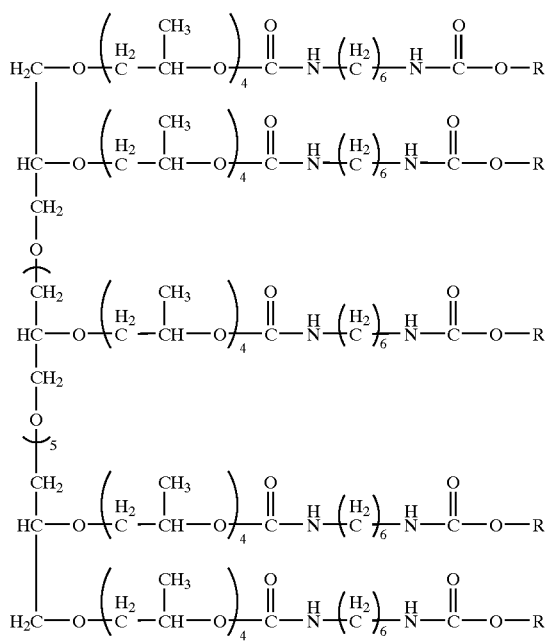

E-1

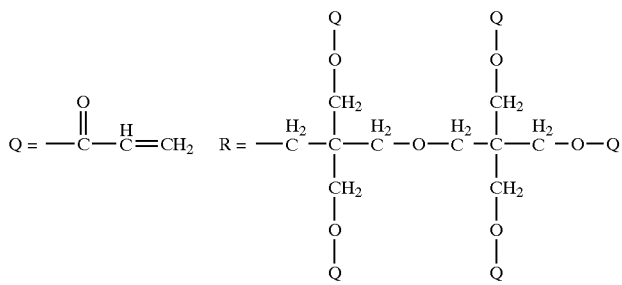

E-2

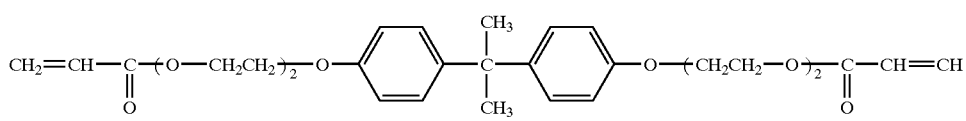

E-3

A 1:1 mixture of

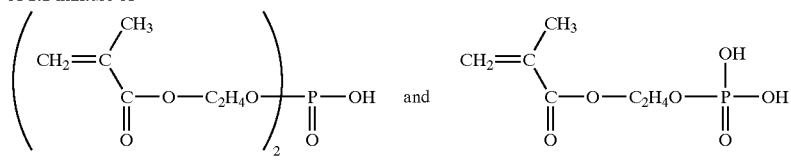

E-4

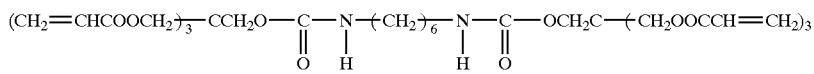

The obtained photosensitive lithographic printing plate for violaceous laser exposure was evaluated with respect to the following items. The results are shown in Table 1.

Evaluation of Sensitivity

The prepared photosensitive lithographic printing plate was cut into a size of 50×60 mm, and the photosensitive material sample was irradiated for 10 seconds with light from a diffraction spectral irradiation apparatus (RM-23, manufactured by Narumi K.K.) equipped with an xenon lamp U1-501C (1 kW: manufactured by Ushio Inc.) as a light source which provides a logarithmic decrease in incident light intensity along a vertical axis of the lithographic printing plate while incident light on the lithographic printing plate linearly decreases in wavelength along the horizontal axis. The exposed sample was soaked in an aqueous solution containing 0.7 wt. % of sodium carbonate and 0.5 wt. % of an anionic surface active agent (Pelex NBL, manufactured by Kao Corporation) at 28° C. for 30 seconds to develop the image. After development, the minimum amount of exposure energy required for photocuring by light radiation of 410 mn was calculated from the height of the cured image obtained. The smaller the amount of energy, the higher the sensitivity.

S410/S450

The photosensitive material sample was exposed and developed in the same manner as described in the above evaluation of sensitivity, whereupon the minimum exposure energy S410 ($\mu$J/cm$^2$) at a wavelength of 410 nm and the minimum exposure energy S450 ($\mu$J/cm$^2$) at a wavelength of 450 nm were obtained to calculate the ratio (S410/S450).

Here, the symbols A to D in the column of minimum exposure energy in Table 1 represent the following.

A: S410/S450 is at most 0.03
B: S410/S450 exceeds 0.03 and is at most 0.1
C: S410/S450 exceeds 0.1 and is at most 0.5
D: S410/S450 exceeds 0.1

The smaller the ratio, the better the safe light properties under a yellow lamp.

Maximum Peak of Spectral Sensitivity

The photosensitive material sample was exposed and developed in the same manner as described in the above evaluation of sensitivity, whereupon a spectral sensitivity curve was obtained with the horizontal axis indicating the exposure wavelength and the vertical axis indicating the inverse of the minimum exposure energy (sensitivity) at the wavelength indicated by the horizontal axis, and from the spectral sensitivity curve, a wavelength showing the maximum peak of spectral sensitivity was obtained. Here, the exposure wavelength was changed from 350 nm to 650 nm.

Safe Light Properties Under A Yellow Lamp

The photosensitive lithographic printing plate was cut into a size of 30×30 mm, and each sample was left to stand under a yellow lamp (under the condition of being shielded from light having wavelengths of at most about 470 nm) for 1 minute, 2 minutes, 5 minutes, 10 minutes, 20 minutes, 30 minutes or 40 minutes, followed by development in the same manner as described above, to obtain the maximum time for which the photosensitive composition left to stand under a yellow lamp would not be cure (evaluation of 40 minutes at the most).

Here, symbols A to D in the column of safe light properties in Table 1 mean the following.

A: At least 20 minutes
B: At least 10 minutes and less than 20 minutes
C: At least 1 minute and less than 10 minutes
D: Less than 1 minute

Example 15

A photosensitive lithographic printing plate was prepared in the same manner as described in Example 12 by successively coating and drying the photosensitive composition coating fluid and the protective layer coating fluid, except that the support (2) was used instead of the support (1), and evaluations were conducted in the same manner. The results are shown in Table 1.

TABLE 1

| | Radical generator (part by weight) | Sensitizing pigment (part by weight) | Absorption maximum (nm) | Amount of ethylenic monomer-1 (part by weight) | Amount of ethylenic monomer-3 (part by weight) | Amount of ethylenic monomer-4 (part by weight) | Amount of N-phenylglycine benzyl ester (part by weight) | Amount of tribenzyl-amine (part by weight) | S410 ($\mu J/cm^2$) | S410/S450 | Safe light properties |
|---|---|---|---|---|---|---|---|---|---|---|---|
| Ex. 1 | R-1 (15) | S-1 (9) | 410 | (22) | (11) | (0) | (5) | (3) | 14 | 0.026 | 20 min. |
| Ex. 2 | R-1 (10) | S-1 (6) | 410 | (22) | (11) | (0) | (5) | (3) | 15 | B | 40 min. |
| Ex. 3 | R-3 (5) | S-1 (3) | 410 | (22) | (11) | (0) | (5) | (3) | 18 | C | 40 min. |
| Ex. 4 | R-1 (10) | S-1 (6) | 410 | (22) | (11) | (0) | (5) | (0) | 22 | B | 40 min. |
| Ex. 5 | R-1 (10) | S-1 (6) | 410 | (0) | (11) | (33) | (5) | (3) | 24 | B | 40 min. |
| Ex. 6 | R-2 (15) | S-1 (9) | 410 | (0) | (11) | (22) | (5) | (0) | 24 | 0.026 | 30 min. |
| Ex. 7 | R-2 (15) | S-1 (6) | 410 | (0) | (11) | (22) | (5) | (0) | 24 | 0.038 | 30 min. |
| Ex. 8 | R-2 (10) | S-1 (6) | 410 | (0) | (11) | (22) | (5) | (0) | 30 | 0.032 | 40 min. |
| Ex. 9 | R-2 (5) | S-1 (6) | 410 | (0) | (11) | (22) | (5) | (0) | 43 | At most 0.021*[2] | 40 min. |
| Ex. 10 | R-1 (5) | S-1 (4.5) | 410 | (0) | (11) | (22) | (5) | (0) | 54 | At most 0.027*[2] | 40 min. |
| Ex. 11 | R-3 (5) | S-1 (3) | 410 | (0) | (11) | (22) | (5) | (0) | 54 | 0.38 | 1 min. |
| Ex. 12 | R-1 (15) | S-1 (9) | 410 | (11) | (6) | (22) | (3) | (5) | 15 | A | A |
| Ex. 13 | R-1 (15) | S-1 (9) | 410 | (11) | (6) | (22) | (8) | (3) | 22 | A | A |
| Ex. 14 | R-3 (15) | S-1 (9) | 410 | (11) | (6) | (22) | (8) | (0) | 27 | A | A |
| Comp. Ex. 1 | R-3 (5) | S-2 (3) | 450 | (0) | (11) | (22) | (5) | (0) | 24 | 2.25 | Nil |
| Comp. Ex. 2 | R-2 (15) | S-4 (9) | Not measured | (0) | (11) | (22) | (5) | (0) | F*[3] | — | — |
| Comp. Ex. 3 | R-2 (15) | S-4 (9) | Not measured | (22) | (11) | (0) | (5) | (3) | F*[3] | — | — |
| Comp. Ex. 4 | R-3 (5) | S-2 (3) | 450 | (22) | (11) | (0) | (5) | (3) | 14 | D | D |
| Comp. Ex. 5 | R-3 (5) | S-2 (3) | 450 | (0) | (11) | (33) | (5) | (3) | 21 | D | D |
| Ex. 15 | R-1 (15) | S-1 (9) | 410 | (11) | (6) | (22) | (3) | (5) | 15 | A | D |

*[1]: "Nil" means that the plate was cured after having been left to stand for 1 minute.
*[2]: It was impossible to form an image with an energy of about 2,000 $\mu J/cm^2$ by exposure at a wavelength of 450 nm under the above conditions.
*[3]: "F" means that it was impossible to form an image with an energy of about 2,000 $\mu J/cm^2$ by exposure at a wavelength of 410 nm under the above conditions.

From the above evaluation above of spectral sensitivity, the minimum exposure for image formation for each of the photosensitive material samples of Examples 1 to 15 at a wavelength longer than 450 nm was higher than the value at a wavelength of 450 nm. On the other hand, the minimum exposure for image formation for the photosensitive material sample of Comparative Example 1 at a wavelength longer than 450 nm was higher than the value at a wavelength of 450 nm. Further, each of the photosensitive layers of Examples 1 to 15 showed a maximum peak at 410 nm within a range ranging from 350 to 650 nm.

Example 16

A photosensitive lithographic printing plate prepared in the same manner as described in Example 1 was image-exposed by means of a 410 nm violaceous laser printing plate exposure apparatus (Cobalt 8) manufactured by Escher Glad at a laser light output of 0.5 mW with a laser beam spot diameter of 12 $\mu$m at a scanning density of 5,080 dpi at a scanning rate of 167 m/s. The image-exposed photosensitive lithographic printing plate was developed in the same manner as described in Example 1, whereupon a print having a high quality image was obtained. The printing plate exposure energy was 30 $\mu J/cm^2$.

With respect to a photosensitive lithographic printing plate prepared in the same manner as described in Examples 1 to 15, an image can be formed by conducting image exposure in the same manner as described in Example 16 by means of a 410 nm violaceous laser printing plate exposure apparatus (Cobalt 8) manufactured by Escher Glad at a laser light output of 0.5 mW with a laser beam spot diameter of 12 μm, at a scanning density of 5,080 dpi at a scanning rate of 167 m/s, followed by development.

The photosensitive lithographic printing plate of the present invention is highly sensitive upon exposure to laser light ranging from 390 to 430 nm, and accordingly an image can efficiently be formed by means of laser light ranging in wavelength from 390 to 430 nm.

Further, as a preferred embodiment, the composition exhibits excellent safe light properties under a yellow lamp and exhibits excellent handling efficiency.

The disclosures of Japanese Patent Application Nos. 2000-117803 filed on Apr. 19, 2000; 2000-131995 filed on May 1, 2000; 2000-131996 filed on May 1, 2000; 2000-364310 filed on Nov. 30, 2000; 2000-368412 filed on Dec. 4, 2000; 2000-369415 filed on Dec. 5, 2000 and 2001-016537 filed on Jan. 25, 2001, including specification, claims, drawings and summary are incorporated herein by reference.

Obviously, numerous modifications and variations of the present invention are possible in light of the above teachings. It is, therefore, to be understood that within the scope of the appended claims, the invention may be practiced otherwise than as specifically described herein.

What is claimed as new and is intended to be secured by Letters Patent is:

1. A photosensitive lithographic printing plate, comprising a photosensitive layer and a protective layer formed in this order on a support, wherein said photosensitive layer has a maximum peak of spectral sensitivity within the wavelength range of 390 to 430 nm, the minimum exposure for said photosensitive lithographic printing plate for image formation at a wavelength of 410 nm (S410) is at most 100 μJ/cm², and the relation between the minimum exposure for image formation at a wavelength of 450 nm (S450) and the minimum exposure for image formation at a wavelength of 410 nm (S410) is 0<S410/S450≦0.1, said photosensitive layer further comprising (A) an ethylenic monomer, (B) a sensitizing pigment and (C) a radical generator, the ethylenic monomer being a urethane compound (a3) having at least four urethane linkages and at least four addition-polymerizable double bonds in one molecule.

2. The photosensitive lithographic printing plate according to claim 1, wherein the minimum exposure for image formation at each wavelength exceeding 450 nm and at most 650 nm is higher than the minimum exposure for image formation at a wavelength of 450 nm(S450).

3. The photosensitive lithographic printing plate according to claim 2, wherein the maximum peak of spectral sensitivity within the wavelength range of 390 to 430 nm is the maximum peak of spectral sensitivity within the wavelength range of 350 to 650 nm.

4. The photosensitive lithographic printing plate according to claim 1, wherein said urethane compound (a3) having at least four urethane linkages and at least four addition-polymerizable double bonds in one molecule has a molecular weight of from 600 to 200,000.

5. The photosensitive lithographic printing plate according to claim 1, wherein said urethane compound (a3) having at least four urethane linkages and at least four addition-polymerizable double bonds in one molecule is represented by the following formula (II):

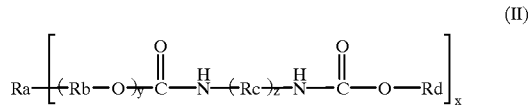

(II)

wherein x is an integer ranging from 4 to 20, y is an integer ranging from 0 to 15, z is an integer ranging from 1 to 15, Ra is a group having a repeating unit derived from alkyleneoxy or aryleneoxy, and having from 4 to 20 oxy groups capable of combining with Rb, each of Rb and Rc which are independent of each other, is a $C_{1-10}$ alkylene group, and Rd is an organic residue having from 1 to 10 (meth)acrylic group, provided that each of Ra, Rb, Rc and Rd which are independent of one another, may have a substituent.

6. The photosensitive lithographic printing plate according to claim 1, wherein the urethane compound (a3) as the ethylenic monomer (A), is obtained by reacting a compound having at least four active isocyanate groups in one molecule (a1) with a compound having at least one hydroxyl group and at least two addition-polymerizable double bonds in one molecule (a2).

7. The photosensitive lithographic printing plate according to claim 6, wherein the compound (a1) having at least four active isocyanate groups in one molecule has a molecular weight of at least 500.

8. A photosensitive lithographic printing plate comprising a photosensitive layer and a protective layer formed in this order on a support, said photosensitive layer containing (A) an ethylenic monomer, (B) a sensitizing pigment and (C) a radical generator, wherein the radical generator (C) contains a hexaarylbiimidazole compound or a titanocene compound, and the sensitizing pigment (B) contains a dialkylaminobenzene compound, wherein said ethylenic monomer is a urethane compound (a3) having at least four urethane linkages and at least four addition-polymerizable double bonds in one molecule.

9. The photosensitive lithographic printing plate according to claim 8, wherein the minimum exposure for image formation at each wavelength exceeding 450 nm and at most 650 nm is higher than the minimum exposure for image formation at a wavelength of 450 nm(S450).

10. The photosensitive lithographic printing plate according to claim 9, wherein the maximum peak of spectral sensitivity within the wavelength range of 390 to 430 nm is the maximum peak of spectral sensitivity within the wavelength range of 350 to 650 nm.

11. The photosensitive lithographic printing plate according to claim 8, wherein said urethane compound (a3) having at least four urethane linkages and at least four addition-polymerizable double bonds in one molecule has a molecular weight of from 600 to 200,000.

12. The photosensitive lithographic printing plate according to claim 8, wherein said urethane compound (a3) having at least four urethane linkages and at least four addition-polymerizable double bonds in one molecule is represented by the following formula (II):

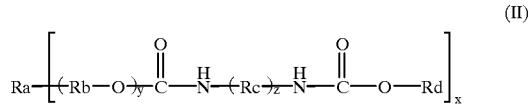

(II)

wherein x is an integer ranging from 4 to 20, y is an integer ranging from 0 to 15, z is an integer ranging from 1 to 15, Ra is a group having a repeating unit derived from alkyleneoxy or aryleneoxy, and having from 4 to 20 oxy groups capable of combining with Rb, each of Rb and Rc which are independent of each other, is a $C_{1-10}$ alkylene group, and Rd is an organic residue having from 1 to 10 (meth)acrylic group, provided that each of Ra, Rb, Rc and Rd which are independent of one another, may have a substituent.

13. The photosensitive lithographic printing plate according to claim 8, wherein the urethane compound (a3) as the ethylenic monomer (A), is obtained by reacting a compound having at least four active isocyanate groups in one molecule (a1) with a compound having at least one hydroxyl group and at least two addition-polymerizable double bonds in one molecule (a2).

14. The photosensitive lithographic printing plate according to claim 13, wherein the compound (a1) having at least four active isocyanate groups in one molecule has a molecular weight of at least 500.

* * * * *

UNITED STATES PATENT AND TRADEMARK OFFICE
CERTIFICATE OF CORRECTION

PATENT NO. : 6,689,537 B2
DATED : February 10, 2004
INVENTOR(S) : Urano et al.

It is certified that error appears in the above-identified patent and that said Letters Patent is hereby corrected as shown below:

<u>Title page, Item [54] and Column 1, lines 1-3,</u>
Title, should read -- [54] PHOTOSENSITIVE LITHOGRAPHIC PRINTING PLATE AND METHOD FOR MAKING A PRINTING PLATE --

Signed and Sealed this

Eighteenth Day of May, 2004

JON W. DUDAS
*Acting Director of the United States Patent and Trademark Office*